(12) United States Patent
Hayakawa

(10) Patent No.: US 6,888,875 B2
(45) Date of Patent: May 3, 2005

(54) LIGHT SOURCE APPARATUS EQUIPPED WITH A GAN TYPE SEMICONDUCTOR LASER, A METHOD OF ELIMINATING STRAY LIGHT, AND AN IMAGE FORMING APPARATUS

(75) Inventor: Toshiro Hayakawa, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/056,038

(22) Filed: Jan. 28, 2002

(65) Prior Publication Data

US 2003/0142718 A1 Jul. 31, 2003

(51) Int. Cl.[7] .................................................. H01S 3/08
(52) U.S. Cl. ...................................... 372/108; 372/103
(58) Field of Search .......................... 372/99, 101–109, 372/46, 43–50, 23, 36, 34

(56) References Cited

U.S. PATENT DOCUMENTS

| | | | | |
|---|---|---|---|---|
| 4,464,021 A | * | 8/1984 | Brown et al. ............... 359/243 |
| 4,656,641 A | * | 4/1987 | Scifres et al. ............... 372/103 |
| 4,832,469 A | * | 5/1989 | Noguchi et al. ............. 359/485 |
| 5,557,115 A | * | 9/1996 | Shakuda ...................... 257/81 |
| 5,627,847 A | * | 5/1997 | Leger ............................. 372/9 |
| 5,657,335 A | * | 8/1997 | Rubin et al. .................. 372/44 |
| 5,864,523 A | * | 1/1999 | Yoshizawa ................ 369/44.23 |
| 5,895,932 A | * | 4/1999 | Bojarczuk et al. ........... 257/103 |
| 5,898,185 A | * | 4/1999 | Bojarczuk et al. ........... 257/103 |
| 6,043,515 A | * | 3/2000 | Kamiguchi et al. ......... 257/103 |
| 6,124,966 A | * | 9/2000 | Yokoyama ................... 359/339 |
| 6,242,328 B1 | * | 6/2001 | Shin ............................ 438/528 |
| 6,345,063 B1 | * | 2/2002 | Bour et al. .................... 372/45 |
| 6,400,513 B1 | * | 6/2002 | Southwell .................... 359/641 |
| 6,407,724 B2 | * | 6/2002 | Waldern et al. ................ 345/8 |
| 2003/0169410 A1 | * | 9/2003 | Matsumoto et al. .......... 355/53 |

FOREIGN PATENT DOCUMENTS

| | | |
|---|---|---|
| JP | 49-104590 | 10/1974 |
| JP | 63-136018 | 6/1988 |
| JP | 09-073057 | 3/1997 |
| JP | 11-068256 | 3/1999 |
| JP | 11-074559 A | 3/1999 |

* cited by examiner

*Primary Examiner*—Nyun Oh Harvey
*Assistant Examiner*—Tuan N. Nguyen
(74) *Attorney, Agent, or Firm*—Sughrue Mion PLLC

(57) ABSTRACT

A light source apparatus equipped with a GaN type semiconductor laser, wherein deformation of the shape of the light spot due to fluctuations in the drive current of the light emitting element is prevented, is provided. A light source apparatus equipped with a GaN type semiconductor laser is provided with a slit panel or other spatial filter for eliminating stray light, which amounts to 20% or less of the total output occurring when the GaN type semiconductor laser is driven at maximum output, from the light emitted from the GaN type semiconductor laser.

22 Claims, 15 Drawing Sheets

F I G . 5
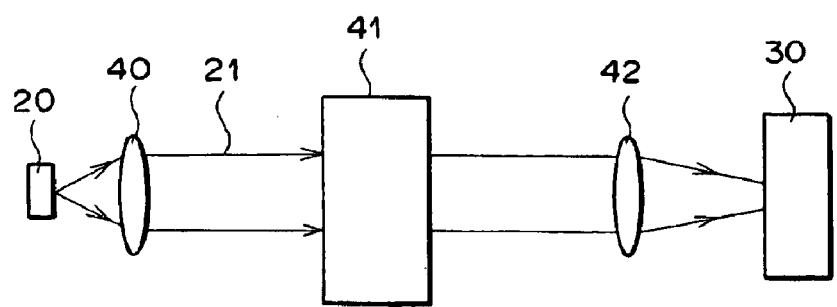

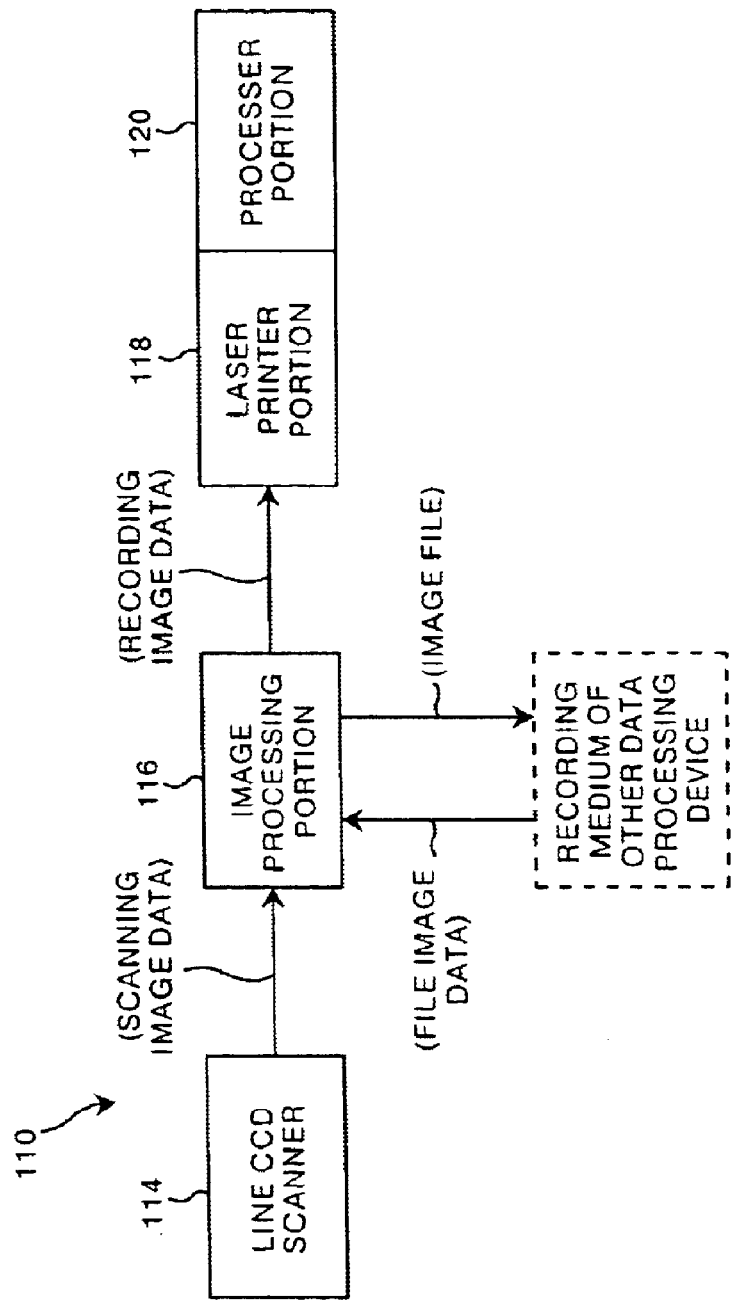

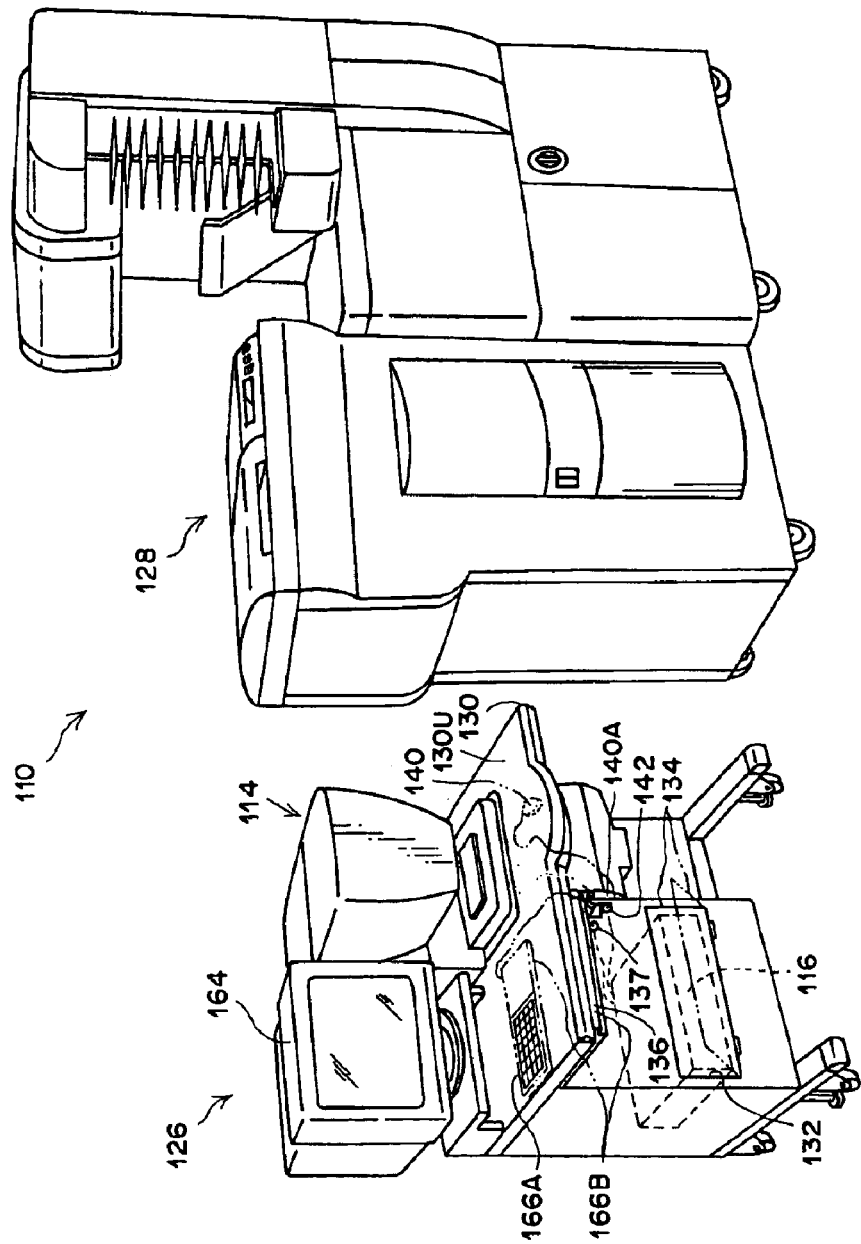

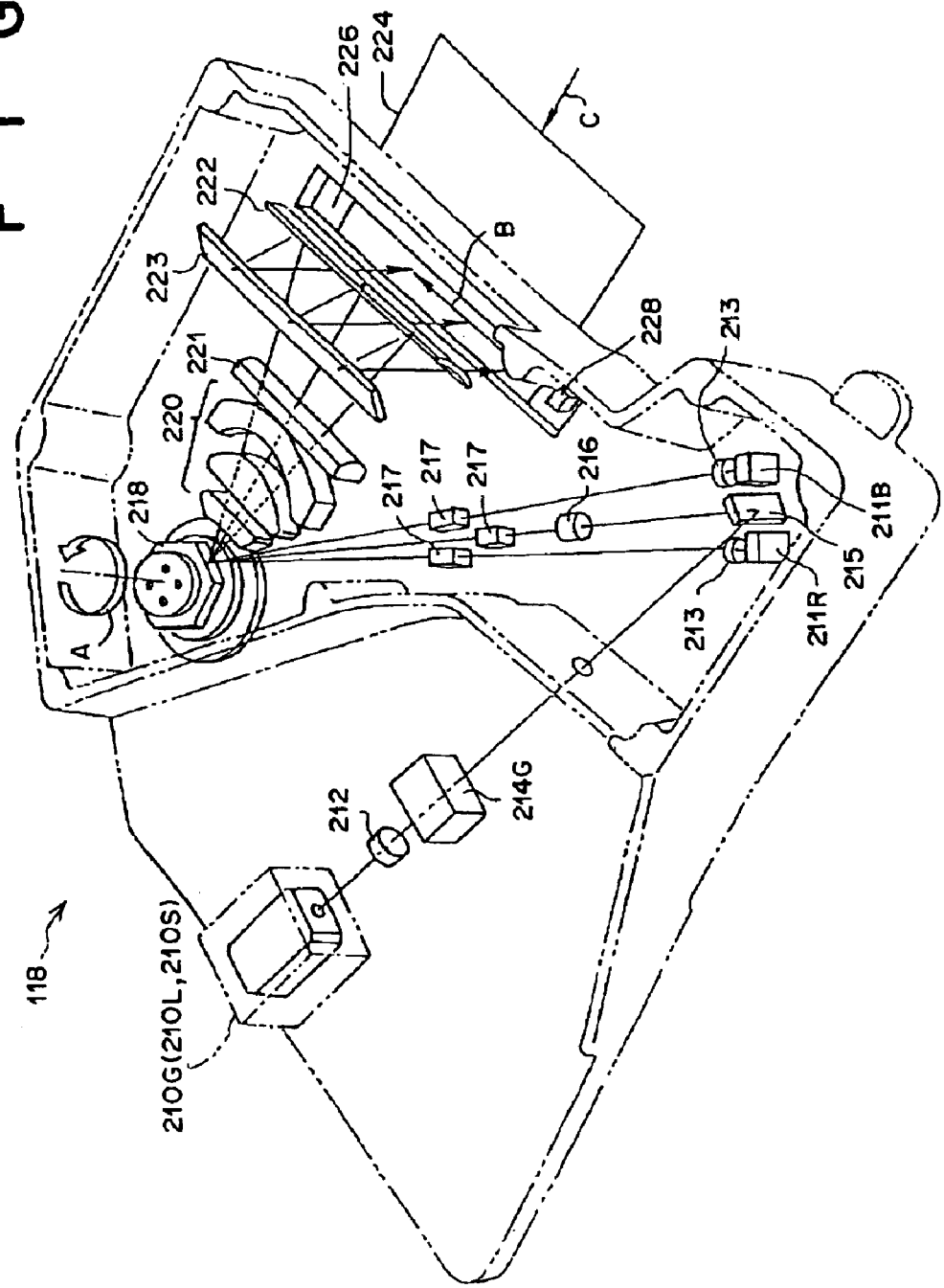

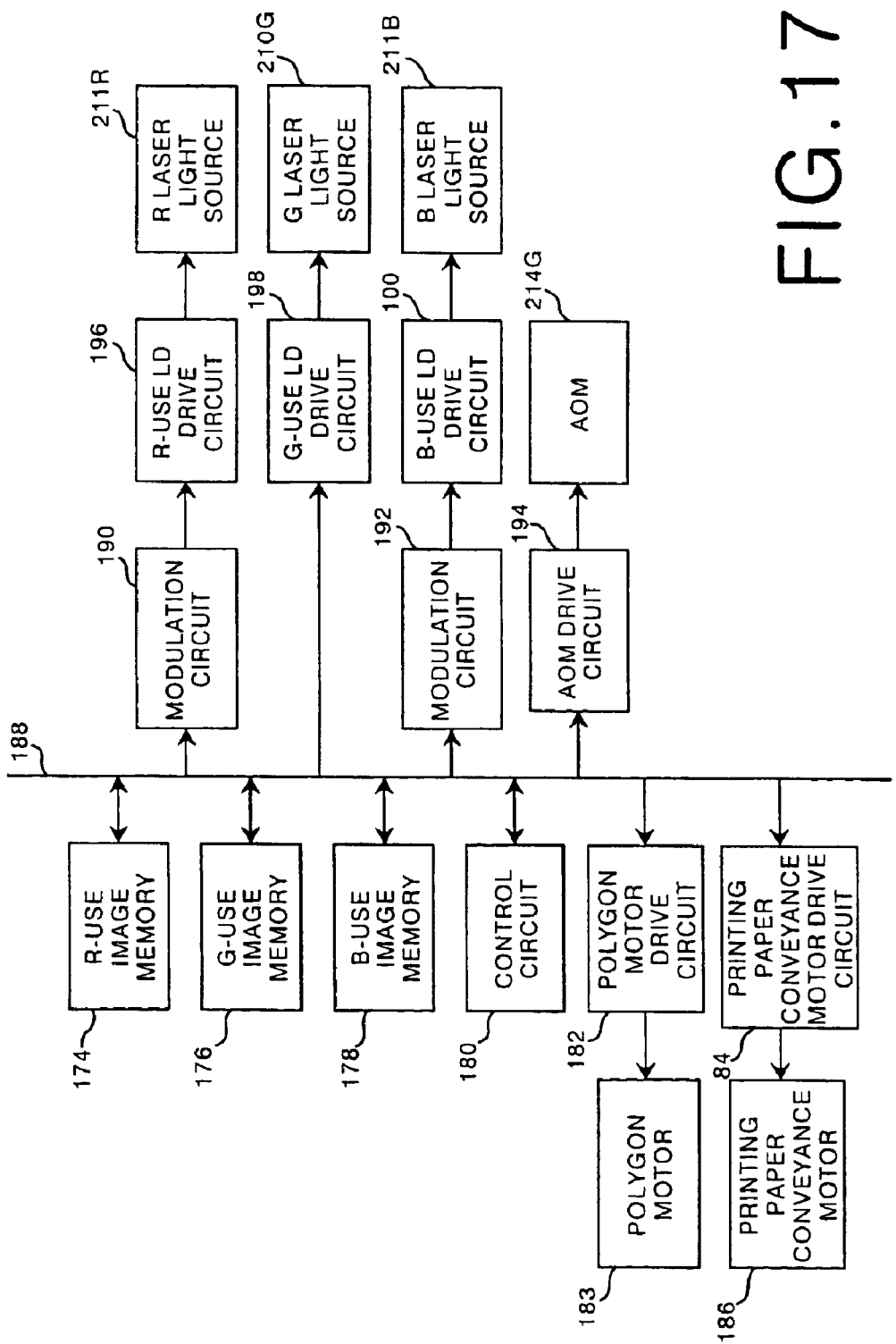

LIGHT SOURCE APPARATUS EQUIPPED WITH A GAN TYPE SEMICONDUCTOR LASER, A METHOD OF ELIMINATING STRAY LIGHT, AND AN IMAGE FORMING APPARATUS

BACKGROUND OF THE INVENTION

1. Field of the Invention

The present invention relates generally to a light source apparatus equipped with a GaN type semiconductor light emitting element, and more particularly to a light source apparatus equipped with a GaN type semiconductor light emitting element that has a stray light eliminating function.

Further, the present invention relates to a method of eliminating the aforementioned stray light.

Still further, the present invention relates to an image forming apparatus for scanning a photosensitive material with light which has been modulated based on image data and forming an image borne by said image data.

2. Description of the Related Art

Presently, GaN type semiconductor lasers, which comprise an active layer formed of InGaN, InGaNAs, or GaNAs, that emit blue light are nearing practical application. Further, a so-called SLD (Super Luminescent Diode), which is a light emitting diode provided with an active layer of a striped structure formed of a GaN type semiconductor has also been disclosed, as described in Japanese Unexamined Patent Publication No. 11(1999)-74559, for example. Although this SLD does not generate laser oscillation, because the emission region is controlled by the striped configuration, this SLD can emit a green or blue light beam having a narrow emission angle and a microscopic emission radius.

These GaN type semiconductor lasers can be employed advantageously in apparatuses, especially color image forming apparatuses, for forming an image borne by image data by scanning a photosensitive material with a light modulated based on said image data, for example, as a light source that emits blue light.

However, according to these GaN type semiconductor light emitting elements (including both a semiconductor laser and a light emitting diode), the stray light characteristically emitted by the semiconductor material is more easily generated. Hereinafter, this phenomenon will be explained in detail.

With regard to an SLD or a semiconductor laser of a configuration comprising a layer of AlGaInP, AlGaAs, InGaAsP or the like formed on a GaAs substrate, the GaAs forming the substrate is a material which is absorptive of the wavelengths of the emitted light; further, the contact layer formed under the electrode on the side opposite from the substrate is also formed of an emission absorptive material such as InGaAs or GaAs. Therefore, even if unnecessary stray light not contained within the width of the emissions wavelength range, normally on the order of several μm, is generated, this stray light becomes absorbed by the substrate and poses no particular problems with respect to practical applications.

As opposed to this, with regard to a GaN type semiconductor light emitting element, a material transparent to light contained within the emission wavelengths, such as sapphire or SiC, is used for the substrate. As a result, a problem has been encountered wherein stray light travels to the terminal end of the substrate side or the opposing electrode side, is reflected and returned to the vicinity of the emission region and a variety of stray light patterns are formed by a plurality of reflections.

FIG. 9 shows a comparative example of the characteristics of the output of the drive current of a GaN type semiconductor laser and a semiconductor laser formed of AlGaInP. As shown in FIG. 9, the intensity of the naturally emitted light below the oscillation threshold value is markedly stronger for the GaN type semiconductor laser.

For cases in which this type of semiconductor light emitting element is driven by a current larger than the laser oscillation threshold value, because the intensity of the light emitted by the laser oscillation is of a higher magnitude in comparison to the intensity of the naturally emitted light, which becomes the origin of the stray light, this stray light normally does not cause the problem described above. However, in the case that the GaN type semiconductor light emitting element is employed as a recording light source for recording a gradation image, and driven in a low current range with direct modulation in order to make it capable of recording a high gradation image, this stray light comes to pose problems in practical application.

That is to say, if the aforementioned semiconductor light emitting element is driven by a low level drive current as described above, the generation of the aforementioned stray light becomes more likely, and in extreme cases, a light emission pattern occurs not only at the stripe portions but over the entirety of the element. The light generated in this way from the portions outside of the stripe portions cause deformation of the spot formed by focusing the recording light, which brings about a degradation of the coupling efficiency of the recording light and the optical system. If such a state is produced, it becomes difficult to accurately control the quantity of the recording light (the exposure light quantity) when a high gradation image is to be recorded, and the image quality of the recorded image is deteriorated.

SUMMARY OF THE INVENTION

The present invention has been developed in view of the foregoing circumstances, and it is a primary object of the present invention to prevent the changes to the spot shape of the recording light due to fluctuations in the drive current of a light emitting element occurring in a light source apparatus equipped with a GaN type semiconductor light emitting element.

Further, another object of the present invention is to prevent deterioration of the image quality, due to changes in the spot shape of the recording light, of an image formed by an image forming apparatus, which comprises a GaN type semiconductor laser as the light source thereof, for forming an image borne by image data by scanning a photosensitive material with a light modulated based on said image data.

The light source apparatus equipped with a GaN type semiconductor light emitting element according to the present invention is provided with a spatial filter for eliminating stray light (e.g., the stray light generated when the drive current driving a GaN type semiconductor light emitting element is less than the laser oscillation threshold value) from the light emitted from GaN type semiconductor light emitting element; said stray light amounting to 20% or less of the total output of the light emitted from said GaN type semiconductor light emitting element when said GaN type semiconductor light emitting element is driven at the maximum output thereof.

Note that for cases in which a focusing optical system for focusing the light emitted from the GaN type semiconductor light emitting element has been provided, a slit panel or a pinhole panel disposed adjacent to the convergence position of this focusing optical system or, alternatively, a partially reflective mirror that reflects a portion of the focused light near the convergence position, can be used as the spatial filter.

Further, a polarization element that eliminates light components other than the TE mode component (a polarized light component having an electrical field vector parallel to the pn junction plane of the GaN type semiconductor light emitting element) of the light emitted from the GaN type semiconductor light emitting element can also be employed as the spatial filter.

Meanwhile, the stray light eliminating method according to the present invention comprises the step of eliminating, by use of a spatial filter, stray light from the light emitted from the light source apparatus equipped with a GaN type semiconductor light emitting element; wherein, said stray light amounting to 20% or less of the total output of the light emitted from said GaN type semiconductor light emitting element when said GaN type semiconductor laser is driven at the maximum output thereof.

Further, the image forming apparatus according to the present invention is an image forming apparatus for scanning a photosensitive material with a light modulated based on image data to form the image borne by said image data; wherein, the above-described light source apparatus according to the present invention is employed as the light source apparatus thereof.

Note that the referents of "photosensitive material" include not only materials in which changes in the concentration thereof occur upon the absorption of light thereby (including cases in which a temporary latent image is formed and the concentration changes are brought about by performing a subsequent development process), but include also photo sensitive heat sensitive materials such as those described in Japanese Unexamined Patent Publication No. 2000-132642.

Further, it is desirable that the image forming apparatus according to the present invention be configured so as to modulate the intensity of the light to be used for scanning the photosensitive material to form a concentration gradation image thereon.

For cases in which modulated recording light is utilized to record a high gradation image, such as when a photographic image is recorded on a silver halide sensitized medium, in general, a recording light intensity dynamic range capable of expressing at least 256 gradations, and particularly for higher image quality images, a dynamic range of approximately 1:1000 is required. Accordingly, in this case, the light source emitting the recording light becomes utilized for emitting light within a range having a maximum light intensity of $\frac{1}{256}$ to a minimum output on the order of $\frac{1}{1000}$. The percentage of the total output occupied by the intensity of the stray light, which has a larger component of naturally emitted light than induced emission laser or super radiance light, becomes relatively smaller as the output of the light emitting element becomes larger. Therefore, in order to obtain a higher quality image, the light source can be run up to as high an output range as possible to relatively reduce the ratio of the stray light component.

However, because there is a limit to the performance capacity of the light emitting element, there is a corresponding limit to how high the output capacity thereof can be improved. Further, there is a problem in that the more the light emitting element is operated at the high output range, the lower the reliability thereof becomes. In investigations about the use of silver halide sensitized media and photographic images, the applicants of the present application have determined that in order to record a high image quality concentration gradation image, the intensity of the stray light must be less than or equal to 20% of the intensity of the total light outputted when the light element output is at its highest. Hereinafter, this point will be described in detail.

FIG. 10 is a model drawing of an image exposure apparatus of the type employing a GaN type semiconductor laser, such as that described above, that scans a silver halide sensitized media with a spot beam; the polygon mirror (rotating multi-faced mirror) and other components of the scanning optical system have been omitted from FIG. 10. In this FIG. 10, the laser beam 71 emitted in a dispersed state from the stripe portions of the GaN type laser 70 is converged by the focusing lens 72 so as to be converged onto the silver halide sensitized medium 73 in a microscopic spot 74. At this time, although naturally emitted light (hereinafter referred to as EL light) 75 of which the emission position as well as the emission direction are random is also emitted from the GaN type semiconductor laser 70, this EL light 75 is not focused into a spot, and becomes stray light that causes a blurred pattern 76 on the silver halide sensitized medium 73.

Moreover, the fact that these undesirable types of stray light cause problems of a higher degree in silver halide exposure systems, which are capable of recording extraordinarily high sensitivity, high quality images in comparison to electron photographic systems or the like, has been elucidated by the research of the applicants of the present application and others.

That is to say, when the silver halide sensitized medium 73 is scanned by the microscopic spot 74 to form a pattern such as the stripe pattern 77 shown in FIG. 11, which has a line width approximately the same as the diameter of the microscopic spot 74, there are cases in which low concentration blurred portions 78 occur between the stripes forming the stripe pattern 77, as shown in FIG. 12, and the originally desired pattern shown in FIG. 11 is not realized. Because of this, the sharpness of the image becomes reduced, and the image quality of the obtained photographic image is remarkably deteriorated. In performing a detailed evaluation relating to the image quality of this type of photographic image, it has been discerned that the photographic image obtained if the intensity of the stray light present when the gradation image is exposed exceeds 20% of the maximum intensity of the exposure light is an image that can in no way be used as a high image quality image.

When intensity modulating the recording light and recording a gradation image, there are also cases in which a low output range, which is 10% or less of the maximum intensity of the recording light, is used; the ratio of the EL light component contained in the recording light becomes larger as the output range of the recording light range used is lowered. FIG. 13 shows the results of the measurement of the drive current and output characteristics of each of a polarization component of which the polarization directionality is parallel to the pn junction plane (a horizontal polarization component), and a polarization component of which the polarization directionality is perpendicular to the pn junction plane (a perpendicular polarization component) of the light that has been emitted from the GaN type semiconductor laser and split by use of a Glan-Thompson Prism. As shown in FIG. 13, because the perpendicular polarization component is formed only of the EL light component, which is not laser oscillation induced, the emission efficiency of this perpendicular component does not change. In contrast to this, the emission efficiency of the horizontal polarization component, which is formed of laser light, increases if the drive current is greater than or equal to the oscillation threshold value (in other words, if the drive current is in the range less than the oscillation threshold value, the emission efficiency is reduced). Therefore, because there is a difference between the emission efficiency of the laser light and the EL light, as the intensity of the light becomes smaller, the percentage of stray light contained in the entire quantity of light is relatively increased, and the negative effect thereof on the image quality is correspondingly increased. Note that this stray light refers to the randomly polarized light emitted from the portions of the semiconductor light emitting element other than the stripe portions of the active layer thereof. Further, this includes light that leaks from the stripe portions of the active layer of the semiconductor light emitting element to the portions other than the stripe portions, and reflected within the interior of the semiconductor light emitting element and emitted outside the element.

Based on the forgoing information, according to the light source apparatus equipped with a GaN type semiconductor light emitting element and the method of eliminating stray light of the present invention: because the stray light, which is 20% or less of the total light output when the GaN type semiconductor light emitting element is driven at the maximum output thereof, is eliminated from the light emitted from said GaN type semiconductor light emitting element by use of a spatial filter as described above, the stray light (this stray light has the characteristics of the type described above if the GaN type semiconductor light emitting element is driven at the maximum output thereof), which is mainly generated when the GaN type semiconductor light emitting element is driven by a drive current in the range less than the laser oscillation threshold value, for example, is eliminated by the spatial filter. Accordingly, the changes caused to the spot shape of the laser beam by this stray light can be prevented.

Therefore, the light source apparatus according to the present invention is capable of accurately controlling the quantity of recording light (exposure light quantity), and can be employed advantageously in the printing, photography, and medical imaging fields wherein high image quality gradation exposures are sought.

For example, the image forming apparatus according to the present invention, which employs the light source apparatus according to the present invention, is capable of preventing the spot shape of the laser beam from becoming a blurred pattern, whereby the image quality can be improved.

In particular, for cases in which a configuration of the image forming apparatus wherein the recording light thereof is intensity modulated and a concentration gradation image is formed on a photosensitive medium is presumed, as explained with reference to FIG. 12, the formation of a blurred pattern by stray light on the portions on which the original image does not appear does not occur, whereby it becomes possible to form a high image quality concentration gradation image having a high degree of sharpness.

BRIEF DESCRIPTION OF THE DRAWINGS

FIG. 5 is a schematic plan view of the second embodiment of the light source apparatus according to the present invention, FIG. 14 is a block diagram of an image forming apparatus according to an embodiment of the present invention, FIG. 15 is a perspective view of the exterior of the image forming apparatus shown in FIG. 14, FIG. 16 is a perspective view of a portion of the optical system employed in the image forming apparatus shown in FIG. 14, and FIG. 17 is a block drawing of the control portion of the image apparatus shown in FIG. 14.

DESCRIPTION OF THE PREFERRED EMBODIMENTS

Figure 1:
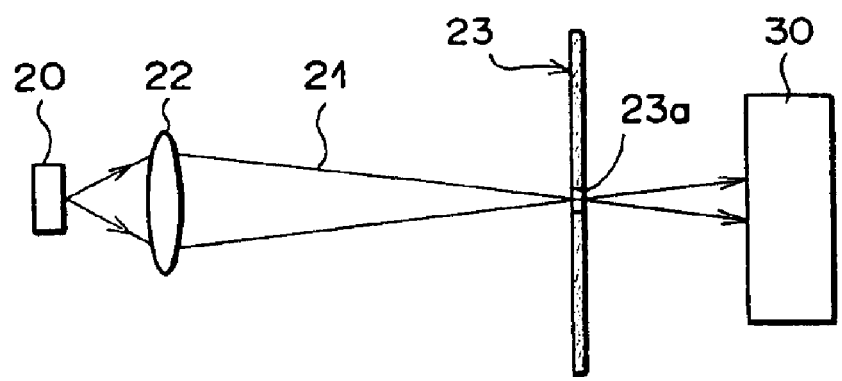
FIG. 1 is a schematic plan view of the light source apparatus according to the first embodiment of the present invention.
Figure 2:
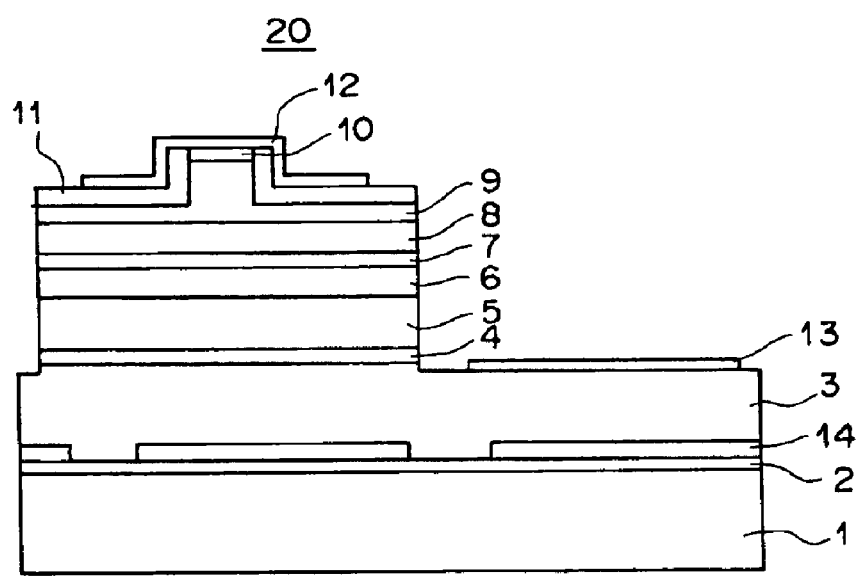
FIG. 2 is a vertical cross-sectional view of the GaN type semiconductor light emitting element employed in the light source apparatus shown in FIG. 1.

Hereinafter the preferred embodiments of the present invention will be explained with reference to the attached drawings. FIG. 1 is a schematic plan view of the light source apparatus equipped with a GaN type semiconductor laser according to the first embodiment of the present invention, and FIG. 2 is a model drawing of a vertical cross-section of the semiconductor laser 20 employed in the light source apparatus shown in FIG. 1.

First, the semiconductor laser 20 will be explained in detail with reference to FIG. 2. This semiconductor laser 20 comprises: a double hetero configuration consisting of an active layer 7 sandwiched between a clad layer 6 and a clad layer 8; and a stripe shaped current injection opening (a portion of cap layer 10) for containing the light; wherein the oscillation wavelength thereof is 400 nm. Further, the cleavage plane of the element serves as a reflective surface, whereby an optically reflective configuration is formed.

Hereinafter, a simple explanation of the manufacturing method of the layer configuration of the semiconductor laser 20 will be provided. After a low temperature n-GaN buffer layer 2 has been formed on a sapphire c surface substrate 1 by use of an MOCVD method, a stripe shaped $SiO_2$ mask 14 is formed. Next, a n-GaN buffer layer 3 (Si doped, 5 μm), an n-$In_{0.05}Ga_{0.95}N$ buffer layer 4 (Si doped, 0.1 μm), an undoped active layer 7, a p-GaN light guiding layer 8 (Mg doped, 0.1 μm), a p-$Al_{0.1}Ga_{0.9}N$ clad layer 9 (Mg doped 0.5 μm), and a p-GaN cap layer 10 are formed sequentially thereon. Then, a p-type impurity is activated by use of a heat process in a nitrogen gas atmosphere.

Note that the active layer 7 is of a triple quantum well configuration formed of: undoped $In_{0.05}Ga_{0.95}N$ (10 nm); an undoped $In_{0.28}Ga_{0.72}N$ quantum well layer (2.5 nm, wavelength 488 nm); undoped $In_{0.05}Ga_{0.95}N$ (5 nm); an undoped $In_{0.28}Ga_{0.72}N$ quantum well layer (2.5 nm); undoped $In_{0.05}Ga_{0.95}N$ (5 nm); an undoped $In_{0.28}Ga_{0.72}N$ quantum well layer (2.5 nm); undoped $In_{0.05}Ga_{0.95}N$ (5 nm); and undoped $Al_{0.1}Ga_{0.9}N$ (10 nm).

Next, in order to form a ridge stripe 6 μm in width, the epitaxial layer other than the ridge stripe portion from the cap layer 10 to midway through the clad layer 9 is removed by RIBE (reactive ion beam etching) utilizing chlorine ions. Next, a SiN film 11 is formed, by use of a plasma-activated CVD method, on the exposure surface including the ridge stripe portions. Then, in order to form the n side electrode, the epitaxial layer other than the portion of the light emitting region including the ridge stripe portions is eliminated by use of an etching process employing photo lithography and RIBE utilizing chlorine ions until the n-GaN buffer layer 3 is exposed. Note that at this time a resonator end face is formed.

Then, a stripe shaped opening (10 μm in width) into which electrical current is injected is formed on the Si film 11 on the upper surface of the ridge portion, and after Ni/Al has been applied as a p side electrode 12 by use of a vacuum deposition method so as to cover said stripe shaped opening and Ti/Al has been applied to the exposed portion of the n-GaN buffer layer 3 as an n side electrode 13 by use of a vacuum deposition method, an ohmic electrode is formed by annealing within nitrogen.

Note that the following is an example of the dimensions of the semiconductor laser 20 shown in FIG. 2: W1=2 μm; W2=300 μm; H1=0.5–1 μm; H2=3–5 μm; and H3=100 μm.

Next, the light source apparatus shown in FIG. 1 and equipped with this semiconductor laser 20 will be explained in detail. As shown in FIG. 1, this light source apparatus comprises: the semiconductor laser 20; a focusing lens 22 for focusing the 400 nm laser beam 21 emitted in a dispersed state from the semiconductor laser 20; and a slit panel 23 disposed at the convergence position of the laser beam 21 focused by the focusing lens 22. Note that photodetector 30 shown in FIG. 1 is a photodetector for detecting the quantity of light of the laser beam 21.

Figure 3:
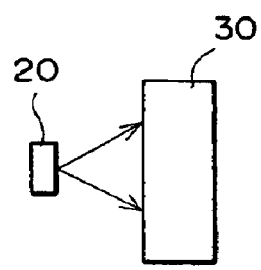
FIG. 3 is a schematic plan view of a light source which is provided as a comparative example to that of the present invention.
Figure 4:
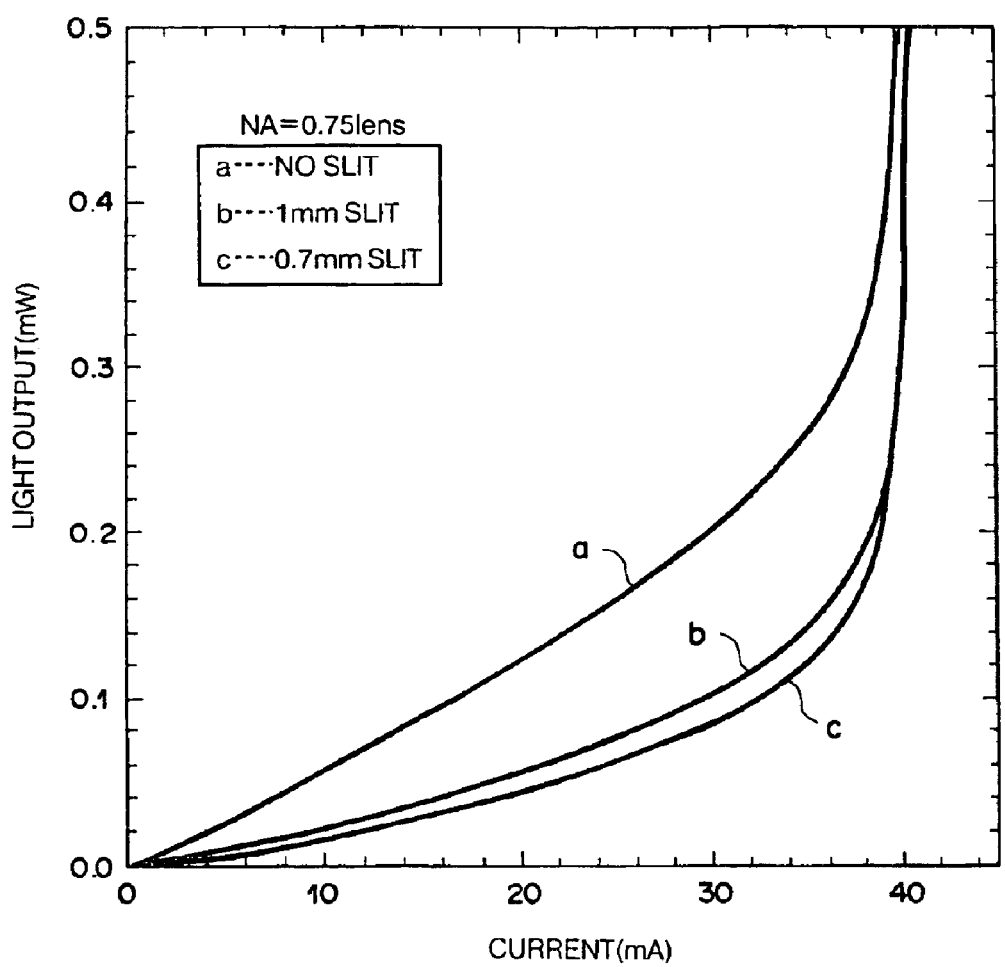
FIG. 4 is a graph showing the characteristic relation between the semiconductor drive current and the emission output characteristics occurring in the light source apparatus shown in FIG. 1 along with that of a comparative example.

The semiconductor laser 20 shown in FIG. 1 is disposed so that the pn junction plane is parallel to the surface of the drawing sheet. On the other hand, the slit panel 23 is disposed so that elongated slit 23a extends in the direction perpendicular to the surface of the drawing sheet. Further, as to the focusing lens 22, that having an opening number of NA=0.75 can be used therefor, and the optical loss occurring due to the insertion of the lens is controlled to approximately 10%. In order to confirm the efficacy of the slit panel 23, as shown in FIG. 3, a system has been built wherein the laser beam 21 emitted from the semiconductor laser 20 in a dispersed state is received directly by the photodetector 30. Accordingly, the system shown in FIG. 3 and the light source apparatus shown in FIG. 1 each change the drive current of the semiconductor laser 20, and the accompanying change in the light output is measured by the photodetector 30. The result of this measurement is shown in FIG. 4. Note that in FIG. 4, curve a shows the measurement result for the case in which there is no slit (the configuration shown in FIG. 3), and curves b and c show the measurement results for cases in which the width of the slit 23a shown in FIG. 1 is 1 mm and 0.7 mm, respectively.

In the example shown in FIG. 4 the laser oscillation threshold value current is approximately 38 mA. The value of the output occurring in the range larger than this threshold current, that is, the output in the laser oscillation range, is almost unchanged whether or not there is a slit panel 23 present. The difference therebetween lies in the difference in the degree of EL light outputted in the range below the oscillation threshold value; for example, the difference between the light output shown by the curves a and c occurring at 40 mA is approximately 0.1 mW. That is to say, regarding the oscillation light emitted from the stripe portions of the active layer 7 of the semiconductor laser 20, it can be stated that the slit panel 23 causes almost no loss in light output.

In contrast to this, in the range below the aforementioned threshold current, that is, in the naturally emitted light range, the light output for the case in which a slit panel 23 has been provided is reduced to approximately ½ of that occurring in the case in which the slit panel 23 is not provided. That is to say, it can be stated that in the naturally emitted light range the stray light emitted from the portions other than the stripe portions of the active layer 7 of the semiconductor laser 20 is cutoff by the slit panel 23.

It can be clearly seen in FIG. 4 that in the naturally emitted light range, approximately ½ of the light quantity of the light emitted from the semiconductor laser 20 is stray light. If the quantity of stray light is large in this way, when this stray light becomes mixed with the laser beam 21, the spot shape of the laser beam 21 becomes deformed; therefore, for cases in which said light source apparatus is employed in a high gradation image recording apparatus, it becomes difficult to accurately control the light quantity of the recording light (exposure light), and the image quality of the recorded images becomes deteriorated. However, if stray light of this type can be cutoff by the slit panel 23, it is possible to avoid these types of problems.

Note that if the width of a slit 23a of the slit panel 23 is made to be very near the width of the emission, it becomes difficult to modulate the optical system; although the permissible degree of mechanical vibration is reduced, even if the width of the slit panel 23a is made comparatively large, that is, 1 mm or 0.7 mm as described above, a result wherein there is a remarkable reduction in the stray light is obtained. In general, if this slit width is less than or equal to twice the spot diameter of the light at the convergence portion, a clear result showing that the stray light has been eliminated can be obtained. Note that for the case of the configuration shown in FIG. 1, if the width of the slit 23a is made to be 0.5 mm or less, the quantity of transmitted light is dramatically reduced.

According to the explanation provided above regarding the configuration shown in FIG. 1, the stray light expanding in the direction perpendicular to the pn conjunction surface (the direction perpendicular to the surface of the drawing sheet) of the semiconductor laser 20 cannot be eliminated by the slit panel 23. In order to eliminate that type of stray light, a pin hole panel can be used instead of the slit panel 23.

Similar effects can also be obtained by employing a partially reflective mirror for partially reflecting the laser beam 21 in the vicinity of the convergence position thereof.

Next, another embodiment of the present invention will be explained. FIG. 5 is a schematic plan view of the second embodiment of the light source apparatus equipped with a GaN type semiconductor laser according to the second embodiment of the present invention. Note that elements included in FIG. 5 that are the same as those shown in FIG. 1 are likewise labeled, and in so far as it is not particularly required, further explanation thereof has been omitted (the same applies to all embodiments hereinafter).

According to the second embodiment of the present invention, the 400 nm wavelength laser beam 21 emitted from the semiconductor laser 20 is collimated by a collimator lens 40, and is then passed through a Glan-Thompson prism 41. Then, the laser beam 21 that has passed through the Glan-Thompson prism 41 is focused by a focusing lens 42 and received by a photodetector 30.

The semiconductor laser 20 shown in FIG. 5 is diposed so that the pn junction plane thereof is parallel to the surface of the drawing sheet. Meanwhile, the Glan-Thompson prism 41, which serves as the polarization element, is disposed at an angle determined so as to transmit only the TE mode component of the laser beam 21 (the polarization component having an electric field vector parallel to that of the pn junction plane), and so that the other polarization components are eliminated.

Figure 6:
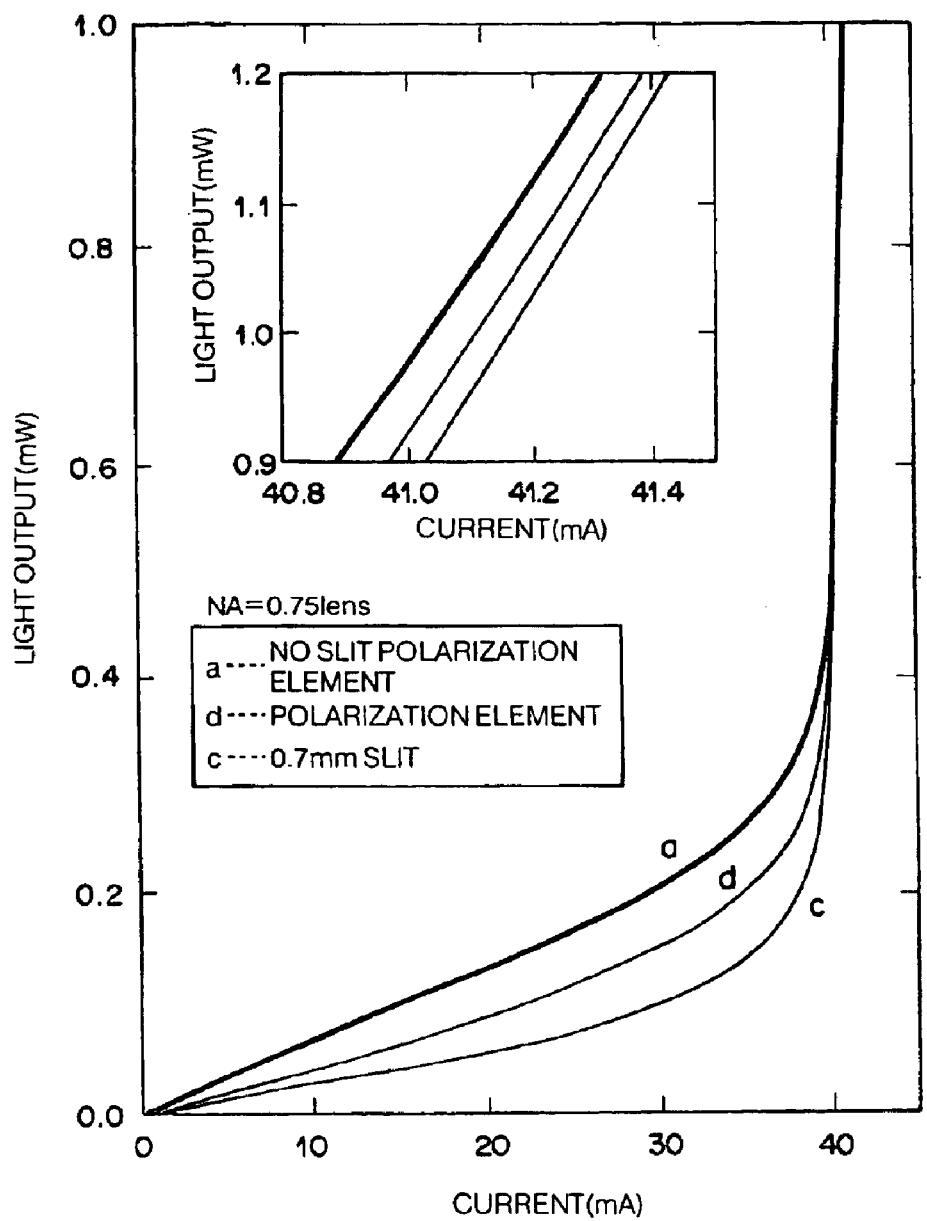
FIG. 6 is a graph showing the characteristic relation between the semiconductor drive current and the emission output characteristics occurring in the light source apparatus shown in FIG. 5 along with that of a comparative example.

In order to confirm the efficacy of the Glan-Thompson prism 41, the drive current of the semiconductor laser 20 in each of the light source apparatus shown in FIG. 5 and the system shown in FIG. 3 described above were changed, and the accompanying change in the light output was measured by the photodetector 30. The result of this measurement is shown in FIG. 6. Note that in FIG. 6, curve a shows the measurement result for the case in which there is no Glan-Thompson prism 41 and no slit panel 23 (the configuration shown in FIG. 3), and curve d show the measurement results for the case in which a Glan-Thompson prism 41 has been provided (the configuration shown in FIG. 5). Further, for the sake of reference, the characteristics for the case in which the width of the slit 23a occurring in the configuration shown in FIG. 1 is 0.7 mm is shown by the curve c.

In the example shown in FIG. 6, the laser oscillation threshold value current is also approximately 38 mA. The output occurring above this threshold current range, that is, in the laser oscillation range, is of a value that is almost unchanged whether the Glan-Thompson prism 41 has been provided or not. As shown in the enlarged view within FIG. 6, the difference in light output after the laser oscillation threshold value has been reached substantially matches the output difference of the EL light occurring before the laser oscillation value has been reached; in this example, the light output difference between curves a and d, as well as the light output difference of the curves d and c is approximately 0.4 mW. That is to say, regarding the TE mode oscillation light emitted from the stripe portions of the active layer 7 of the semiconductor laser 20, there is almost no loss incurred thereof due to the Glan-Thompson prism 41.

In contrast, for cases in which the Glan-Thompson prism 41 has been provided, the light output occurring in the naturally emitted light range, that is, in the range below the oscillation threshold value current, is reduced markedly compared to the case in which the Glan-Thompson prism 41 has not been provided. That is to say, it can be considered that in this naturally emitted light range, the randomly polarized stray light emitted from portions other than the stripe portions of the active layer 7 of the semiconductor laser 20 is by and large cutoff by the Glan-Thompson prism 41.

Note that in the example shown in FIG. 6, although the stray light eliminating efficacy for the case in which a slit panel 23 has been inserted is higher compared to the case in which a Glan-Thompson prism 41 has been inserted, this improvement in the efficacy regarding eliminating stray light lies in the structure or characteristics of each individual element. Accordingly, it is possible to optimize the efficacy of the present invention by selecting and matching the elements to be employed for eliminating stray light. For cases in which a slit panel is employed, a focusing optical system is required for converging the laser beam, and accurate optical adjustments are also required; however, for cases in which a polarizing element is employed, the optical adjustments can be completed with less stringent accuracy and a high degree of freedom is attained in regards to the insertion position of the element.

Although the two embodiments explained above have been equipped only with the basic structure formed of the core portion of the light source apparatus, it is possible to provide the light source apparatus according to the present invention with a scanning optical system formed by utilizing a polygon mirror (a rotatable mirror) or a galvano mirror for scanning or the like. In this case, lenses and other required optical elements can be combined appropriately to form an optical system such as one of those shown in FIGS. 7 and 8.

Figure 7:
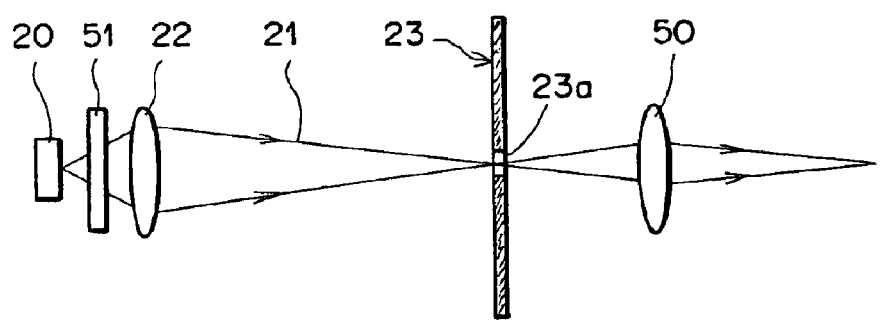
FIG. 7 is a schematic plan view of a light source apparatus according to the third embodiment of the present invention.

In addition to the configuration shown in FIG. 1, the third embodiment shown in FIG. 7 comprises an optical system provided with a focusing lens 50 for focusing the laser beam 21 that has passed through the slit panel 23, and a cylindrical lens 51 for focusing the laser beam 21 only in the direction perpendicular to the surface of the drawing sheet.

Figure 8:
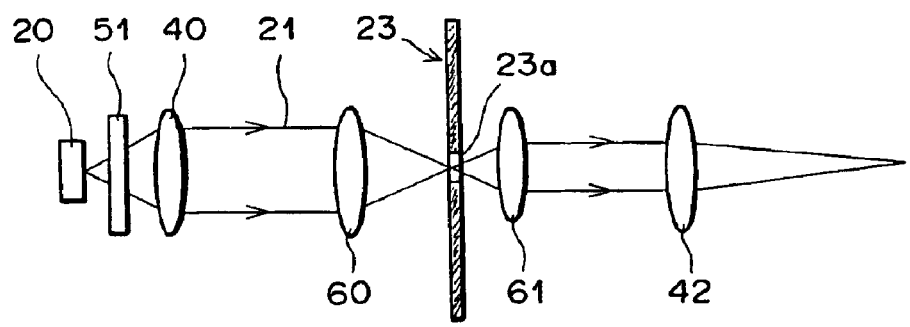
FIG. 8 is a schematic plan view of the light source apparatus according to the fourth embodiment of the present invention.
Figure 9:
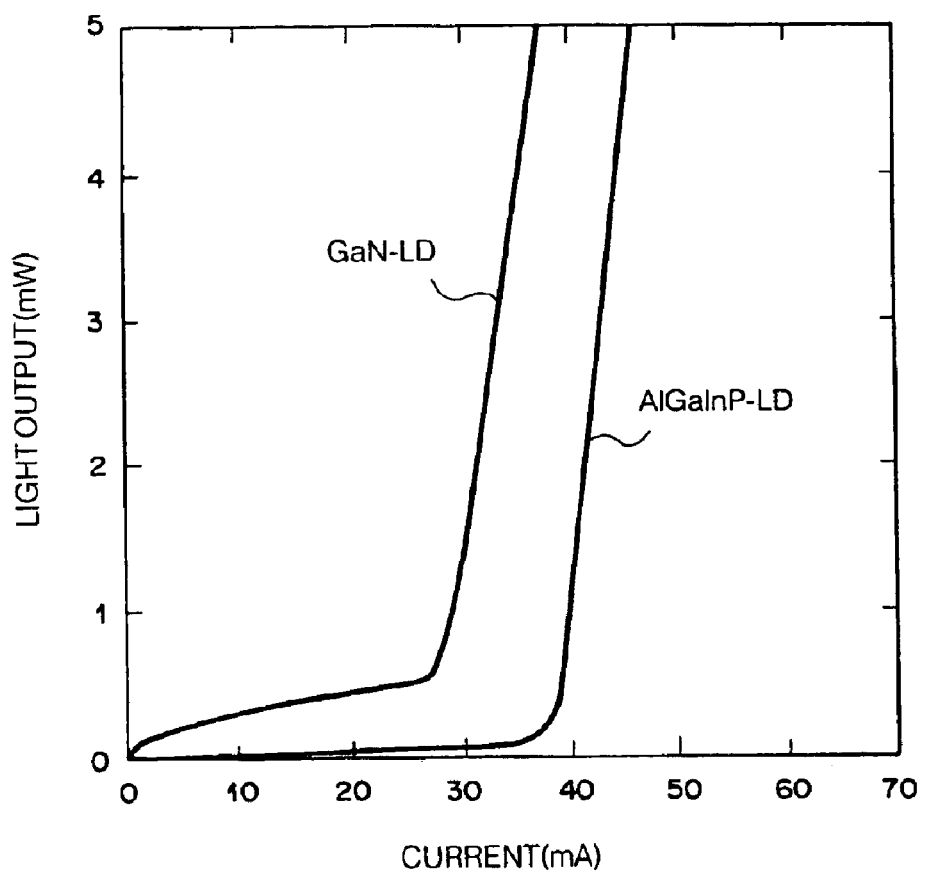
FIG. 9 is a graph showing comparative examples of the characteristic relation between the semiconductor drive current and the emission output characteristics of a GaN type semiconductor laser and those occurring in another type of semiconductor laser.
Figure 10:
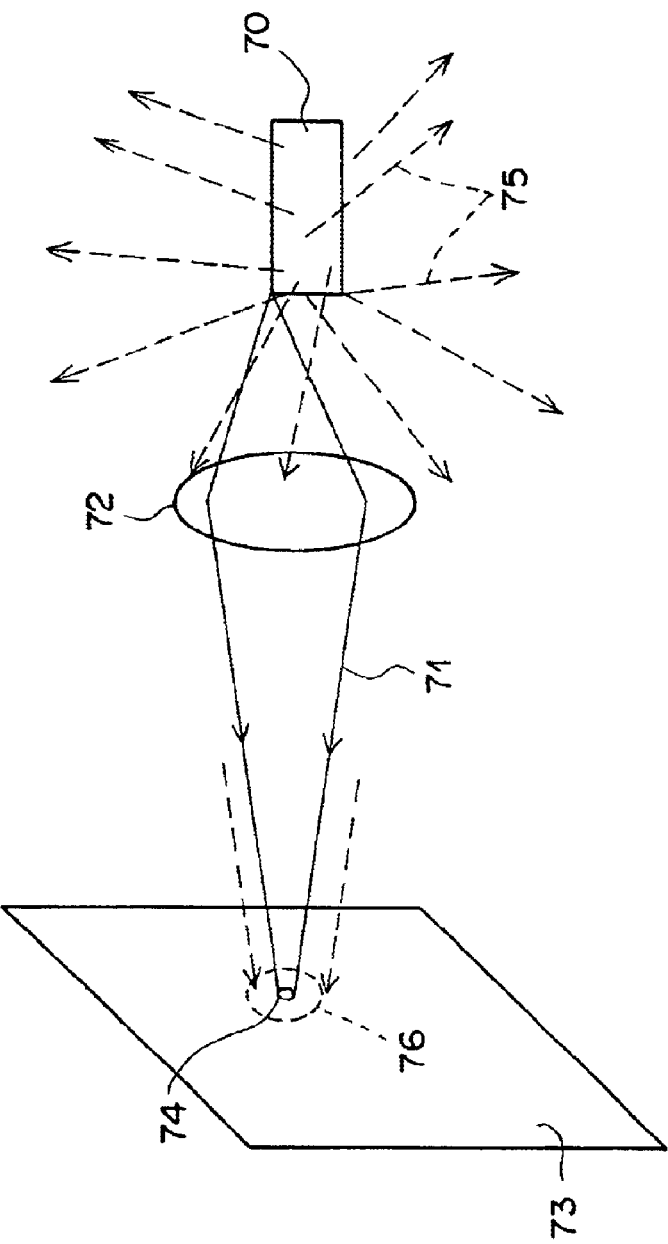
FIG. 10 is a model drawing of a type of image exposure apparatus employing a GaN type semiconductor laser, wherein a silver halide sensitized material is scanned with a spot beam recording light.
Figure 11:
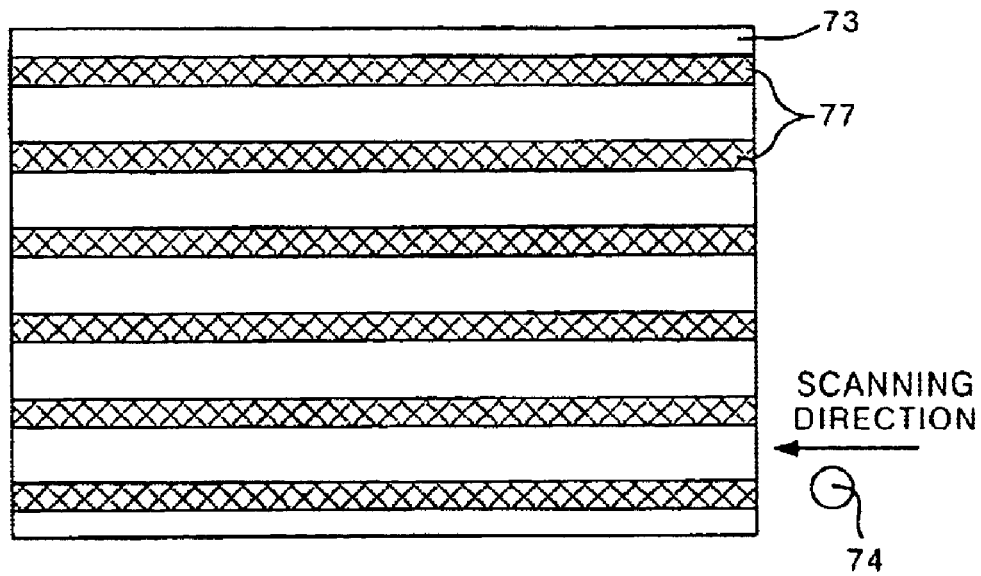
FIG. 11 is a schematic drawing of an example of an exposure pattern produced by the image exposure apparatus shown in FIG. 10.
Figure 12:
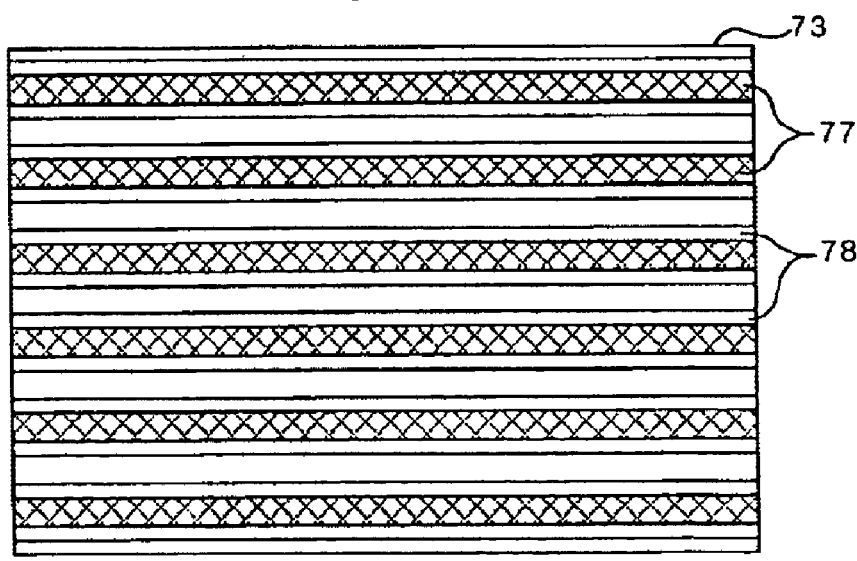
FIG. 12 is a schematic drawing of another example of an exposure pattern produced by the image exposure apparatus shown in FIG. 10.
Figure 13:
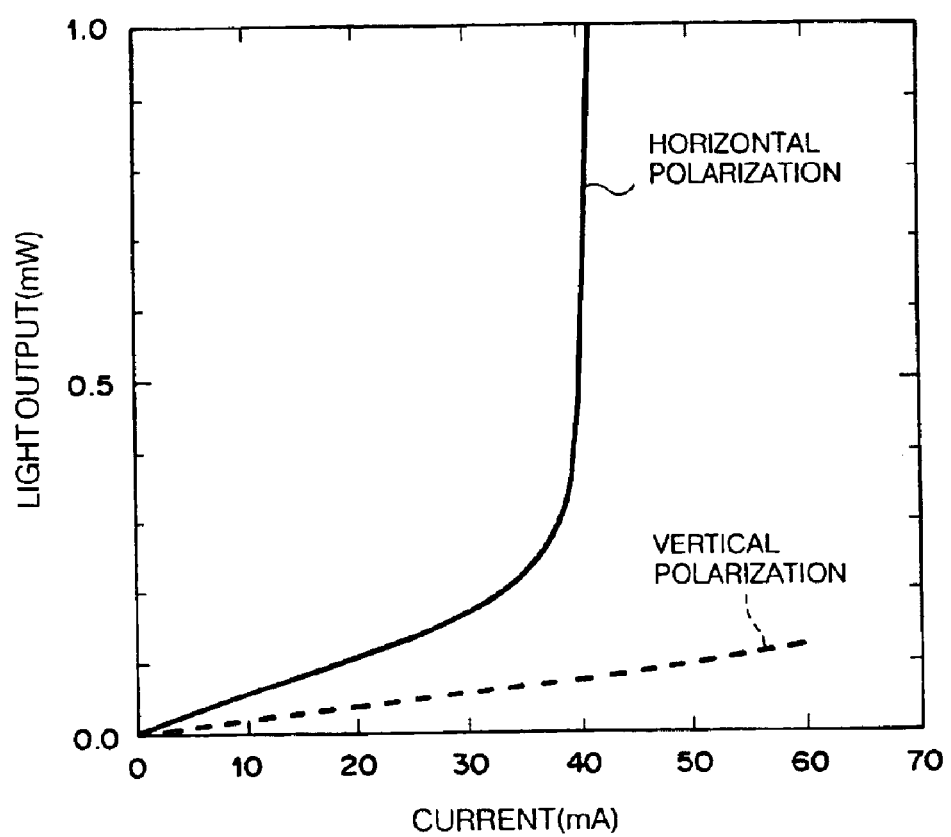
FIG. 13 is a graph showing the relation between the semiconductor drive current and the emission output characteristics for each polarization component occurring in the GaN type semiconductor laser.

Further, the forth embodiment shown in FIG. 8 comprises an optical system provided with a collimator lens 40 and a focusing lens 42 of the same type as those employed in the configuration shown in FIG. 5, in addition to a focusing lens 60 for converging the laser beam 21 that has been collimated by the collimator lens 40 onto the position of the slit panel 23, and a collimator lens 61 for collimating the laser beam 21 that has passed through the slit panel 23.

Next, an embodiment of the image forming apparatus according to the present invention will be explained with reference to FIGS. 14 to 17. Note that a digital lab system is proffered as an example of the image forming apparatus according to the present invention.

First, a general explanation of the entire system will be provided. FIG. 14 is a schematic drawing of the digital lab system 110, and FIG. 15 is an exterior view of the digital lab system shown in FIG. 14. As shown in FIG. 14, the lab system 110 comprises: a line CCD scanner 114; a an image processing portion 116; a laser printer portion 118, which is an image forming apparatus according to the current embodiment; and a processor portion 120; wherein, the line CCD scanner 114 and the image processing portion 116 are provided in an integrated form as the input portion 126 shown in FIG. 126, and the laser printer portion 118 and the processor portion 120 are provided in an integrated form as the output portion 128 shown in FIG. 15.

The line CCD scanner 114 is a means for reading out a film image (a positive or a negative image obtained by developing a photographed image) that has been recorded on a photosensitive medium such as a negative film or a reversal film (hereinafter referred to simply as a photographic film) the line CCD scanner 114 is capable of reading out a photographic image from, for example; a 135 size photographic film, a 110 size photographic film; a photographic film on which a transparent magnetic layer has been formed (240 size photographic film: so-called APS film); and 120 and 220 size (blowny size) photographic film. The line CCD scanner 114 reads out the subject film image by a three-line color CCD, and outputs image data spanning each color data: R (red), G (green), and B (blue).

As shown in FIG. 15, the line CCD scanner 114 is installed on the operations table 130. The image processing portion 116 is housed within the housing portion 132 formed on the bottom side of the operations table 130, and an opening and closing door 134 is provided at the opening of the housing portion 132. The interior portion of the housing portion 132 is normally in the covered state wherein it is concealed by the opening and closing door 134; if the opening and closing door is rotated the interior portion is exposed, and it becomes possible to remove the image processing portion 116.

Further, a display 164 is provided towards the rear of the operations table 130 and two types of keyboards, 166a and 166b are jointly provided. The keyboard 166a is provided as a unit built into the operations table 130. On the other hand, the keyboard 166b is provided so as to be able to be stored within a drawer 136 of the operations table 130 when not in use; when the keyboard 166b is to be used, it is removed from the drawer 136 and stacked on the keyboard 166a. When the keyboard 166b is to be used, by connecting the connector (not shown), which is provided on the distal end of the cord extending from the keyboard 166, to the jack 137 provided on the operations table 130, the keyboard 1666b becomes electrically connected to the image processing portion 116 via the jack 137.

Further, a mouse 140 is provided on the operations surface 130u of the operations table 130. The cord of the mouse 140 extends through a hole 142 provided on the operations table 130 to the interior of the housing portion 132, wherein it is connected to the image processing portion 116. The mouse 140 is stored in the mouse holder 140a when not in use; when the mouse 140 is to be used it is removed from the mouse holder 140a and placed on the operations surface 130u.

The image processing portion 116 inputs the image data outputted from the line CCD 114, that is, the scanner image data, and is also configured so as to be able to input image data obtained from a digital camera, image data obtained by scanning and reading out an original film image other than a reflection original or the like, image data formed by a computer or the like (hereinafter referred to as file image data) from an external portion. This input is obtained by way of a recording medium such as a memory card or the like, or by way of a communications circuit.

The image processing portion 116 performs various types of image processes, such as a correction process or the like, on the inputted image data, and inputs the processed image data obtained thereby into a laser printer portion 118 as recording image data. Further, the image processing portion 116 is configured so as to be capable of outputting processed image data to an external portion as an image data file. This output is recorded on a data recording medium such as a memory card or the like, or is transmitted to other image processing devices over a communications circuit, etc.

The laser printer portion 118 is equipped with R, G, and B laser light sources, and irradiates onto printing paper laser light modulated according to the recording image data inputted from the image processing portion 116 to record the image (latent image) onto the printing paper by use of scanning exposure light. Further, the processor portion 120 performs each type of process, such as color development, bleaching, washing, drying, and the like, on the printing paper on which the latent image has been formed by the scanning exposure light. The image is formed on the printing paper in this manner.

Next, the configuration of the laser printer portion 118 will be explained in detail. FIG. 16 shows the optical system of the laser printer 118. As shown in FIG. 16, the laser printer portion 118 comprises three laser light sources: laser light source 211R, 210G, and 211B. The laser light source 211R is formed of an LD (semiconductor laser) that emits laser light in the red range (hereinafter referred to as R laser light) of, for example, a 685 nm wavelength. Further, the laser light source 210G comprises: an LD 210L, which serves as a light emitting means, and a wavelength converting element (SHG element) 210S for converting the laser light emitted from said LD 210L to laser light of half the wavelength thereof. An oscillation wavelength of 1064 nm, for example, is employed for the LD 210L, whereby laser light in the green range (hereinafter referred to as G laser light) having a wavelength of 532 nm is emitted from the SHG element 210S.

Further, the laser light source 211B is formed of a light source apparatus that emits laser light in the blue range (hereinafter referred to as B laser light) of, for example, a 440 nm wavelength. According to the current embodiment, a light source apparatus equipped with a GaN type semiconductor laser such as that shown in FIG. 1 is employed as the aforementioned light source apparatus.

A collimator lens 212 and an AOM (acoustic optical modulator) 214G, which serves as an external modulating means, are disposed sequentially along the optical path of the laser light emitted from the laser light source 210G. The AOM 214G is disposed so that the light inputted thereto passes through an acoustic optical modulating medium, and is connected to an AOM driver (not shown). When a high frequency signal is inputted from the AOM driver, an ultrasonic frequency corresponding to the high frequency signal is propagated within the acoustic optical modulating material, and the laser light passing through the acoustic optical modulating material is refracted by the effect of the acoustic optical modulation; a refracted laser light of an intensity corresponding to the oscillation width of the high frequency signal is thereby emitted from the AOM 214G.

A flat mirror 215 is disposed along the light path of the light emitted from the AOM 214G; a spherical lens 216, a cylindrical lens 217, and a polygon mirror (rotatable multi-faced mirror) 218 are disposed sequentially along the light path of the light reflected by said flat mirror 215. The G laser light emitted from the AOM 214G is reflected by the flat mirror 215, passes through the spherical lens 216 and the cylindrical lens 217, and then impinges on a predetermined position of the reflection surface of the polygon mirror 218, whereby it is reflected and deflected by said polygon mirror 218.

Meanwhile, a collimator lens 213 and a cylindrical lens 217 are disposed sequentially on the laser light emitting side of the laser light source 211R and the laser light source 211B; the laser beams emitted from the laser light sources 211R and 211B, respectively, are collimated by the collimator lens 213, pass through the cylindrical lens 217 to impinge upon substantially the same predetermined position of the reflection surface of the polygon mirror as that described above, and are reflected and deflected by said polygon mirror 218.

The three laser beams R, G, and B reflected and deflected by the polygon mirror 218 pass through an fθ lens 220 and a cylindrical lens 221 sequentially, and after being reflected by a cylindrical mirror 222, are projected onto the printing paper 224 through an aperture portion 226 after being reflected in a substantially vertical downward direction by a return mirror 223. Note that the return mirror 223 can be omitted and the laser light may be reflected by the cylindrical mirror 222 directly in a substantially vertical downward direction and projected onto the printing paper 224.

Meanwhile, a scanning start detecting sensor (hereinafter referred to as a SOS detecting sensor) 228 for detecting the R laser light that has arrived thereat through the aperture portion 226 is disposed adjacent to the scanning exposure light starting position. Note that the reason the laser light detected by the SOS detecting sensor is the R laser light is that because the light sensitivity of the printing paper is lowest with respect to the R laser light, the light quantity of the R laser light is the largest and is therefore capable of being detected accurately, and the R laser light is reflected by the rotation of the polygon mirror 218 so that said R laser light reaches the SOS detecting sensor 228 fastest. Further, the SOS detecting sensor 228 according to the current embodiment is configured so that the output signal thereof (hereinafter referred to as a sensor output signal) is normally a low level signal, and only when R laser light has been detected does the signal become a high level signal.

The image forming apparatus according to the current embodiment is provided with the control portion shown in FIG. 17. This control portion has a control circuit 180 including a micro computer. The control circuit 180 is connected to a bus 188; image memories 174, 176, and 178 are connected to said bus 188. That is to say, the image memories 174, 176, and 178 are provided as the recording memory that records the image data for recording an image onto the printing paper 224. The image data memory 174 is a memory for recording the R image data; in the same manner, the image data memory 176 is a memory for recording the G image data, and the image data memory 178 is a memory for recording the B image data.

Further, the bus 188 comprises: an R-LD drive circuit 196 for driving the R laser light source; a G-LD drive circuit 198 for driving the G laser light source; and a B-LD drive circuit 100 for driving the B laser light source; wherein the R-use LD drive circuit 196 and the B-use LD drive circuit 100 are connected via modulation circuits 190 and 192, respectively. That is to say, the modulation circuits 190 and 192 form modulation signals based on the image data inputted thereto, and by superimposing the drive current of the LD drive circuits 196 and 100 on these modulation signals, the intensity of each LD forming the laser light source 211R and the laser light source 211B is directly modulated.

Further, an AOM drive current circuit 194 is connected to the bus 188; the driving of the AOM 214G is controlled, and the G laser light emitted from the laser light source 214G is modulated by this AOM 214G.

Still further, the bus 188 is also connected to a polygon motor drive circuit 182 for driving the polygon motor 183 that drives the rotation of the polygon mirror 218, and a printing paper conveyance motor drive circuit 184 for driving the printing paper conveyance motor 186 that conveys at a uniform speed the printing paper 224; each of these drive circuits is controlled by the control circuit 180.

Hereinafter, the operation of the laser printer portion 118 will be explained. When an image is to be recorded onto the printing paper 224, the control circuit 180 of the control portion shown in FIG. 17 performs, based on the image recording parameters inputted from the image processing portion 116 shown in FIG. 14, various types of correction processes on the recording image data to form a scanning exposure light image data in order to record onto the printing paper 224 by the scanning exposure light the image represented by the recording image data inputted from the image processing portion 116; said scanning exposure light image data is recorded in the image data memories 174, 176, and 178.

Then, the control circuit 180 is drives the polygon motor 183 so as to rotate the polygon mirror 218 in the direction indicated by the arrow mark A shown in FIG. 16, and supplies drive current to the semiconductor lasers of the laser light sources 211R, 210G, and 211B, whereby each respective color of laser light is emitted. Further, the control circuit 180 forms a modulation signal based on the scanning exposure light image data; the amplitude of the high frequency signal supplied, according to the level of the modulation signal, to the AOM 214G is changed, and the G laser light emitted from the AOM 214G is modulated thereby. Accordingly, this G laser light is intensity modulated in accordance with the concentration of the image to be recorded on the printing paper 224. This G laser light is irradiated onto the printing paper 224 by way of the flat mirror 215, the spherical lens 216, the cylindrical lens 217, the polygon mirror 218, the fθ lens 220, the cylindrical lens 221, the cylindrical mirror 222, and the return mirror 223.

Further, by modulating the drive current value applied to the laser light sources 211R and 211B, the control circuit 180 intensity modulates the laser light emitted therefrom. Accordingly, the laser light sources 211R and 211B emit R laser light and B laser light, respectively, that has been intensity modulated in accordance with the concentration of the image to be recorded on the printing paper 224. These R and B laser beams are each projected onto the printing paper 224 by way of the collimator lens 213, the cylindrical lens 217, the polygon mirror 218, the fθ lens 220, the cylindrical lens 221, the cylindrical mirror 222, and the return mirror 223.

Then, the spot of each of the R, G, and B laser light, which have been deflected with the rotation of the polygon mirror 218, is moved in the direction indicated by the arrow mark B shown in FIG. 16 and scanned across the printing paper 224, and the printing paper 24 is conveyed at a uniform speed in the direction indicated by the arrow mark C shown in FIG. 16, whereby the widthwise scanning of each laser light is performed, and a two-dimensional image (a latent image) is formed on the printing paper 224 by this scanning exposure light.

The printing paper 224 on which an image has been formed by said scanning exposure light is sent into the processor portion 120, wherein each type of process, such as color development, bleaching, washing, drying, and the like, is performed thereon. In this manner, the photographic latent image formed on the printing paper is developed.

Note that the modulation of the timing of the laser light or of the timing of the conveyance of the printing paper is determined based on the output signal of the SOS detecting sensor 228.

Here, the laser printer 118 according to the current embodiment, because a light source apparatus utilizing a GaN type semiconductor laser is employed as laser light source 211B for emitting B laser light, the above-described stray light is emitted therefrom concurrently with the B laser light. However, according to this light source apparatus shown in FIG. 1, because the stray light on a path toward the printing paper 224 is cutoff by the slit panel 23 as described above, a reduction in the sharpness of the image recorded on the printing paper 224 due to this stray light can be prevented, and it is possible to record a high image quality concentration gradation image.

Note that the light source apparatus according to the present invention and employed in an image forming apparatus is not limited to the particular apparatus of the embodiment shown in FIG. 1; the light source apparatuses according to other embodiments as well are capable of being readily employed.

What is claimed is:

1. A light source apparatus equipped with a GaN type semiconductor light emitting element, comprising
   a GaN type semiconductor light emitting element;
   a spatial filter for eliminating stray light from the light emitted from the GaN type semiconductor light emitting element, wherein
   said stray light amounts to 20% or less of the total output of the light emitted from said GaN type semiconductor light emitting element when said GaN type semiconductor light emitting element is driven at the maximum output thereof,
   the GaN type semiconductor light emitting element has an active layer having stripe portions,
   the stray light is randomly polarized light emitted from portions of the semiconductor light emitting element other than the stripe portions of the active layer, and
   the stray light is cutoff by one of a slit panel and a pinhole panel.

2. A light source apparatus equipped with a GaN type semiconductor light emitting element as defined in claim 1, further comprising
   a focusing optical system for focusing the light emitted from the GaN type semiconductor light emitting element, wherein
   the spatial filter is formed of the slit panel or the pinhole panel disposed adjacent to the convergence position of the light focused by the focusing optical system.

3. A light source apparatus equipped with a GaN type semiconductor light emitting element as defined in claim 2, wherein a slit width of the slit panel is less than or equal to twice a spot diameter of the light at the convergence position.

4. A light source apparatus equipped with a GaN type semiconductor light emitting element as defined in claim 1, further comprising
   a focusing optical system for focusing the light emitted from the GaN type semiconductor light emitting element, wherein
   the spatial filter is formed of a partially reflective mirror that partially reflects the light near the convergence position of the light focused by the focusing optical system.

5. A light source apparatus equipped with a GaN type semiconductor light emitting element as defined in claim 1, wherein
   the spatial filter is a polarization element that eliminates the light components other than the TE mode components of the light emitted from the GaN type semiconductor light emitting element.

6. A light source apparatus equipped with a GaN type semiconductor light emitting element as defined in claim 1, wherein
   the stray light is stray light that is generated when the drive current of the GaN type semiconductor light emitting element is less than the laser oscillation threshold value.

7. A device as defined in claim 6, further comprising an image forming apparatus that scans a photosensitive material with a light modulated based on image data to form the image borne by said image data.

8. A light source apparatus equipped with a GaN type semiconductor light emitting element as defined in claim 1, wherein
   the GaN type semiconductor light emitting element has an active layer having stripe portions, further wherein
   the stray light is randomly polarized light emitted from portions of the semiconductor light emitting element other than the stripe portions of the active layer.

9. A light source apparatus equipped with a GaN type semiconductor light emitting element as defined in claim 8, wherein
   the stray light includes light that leaks from the stripe portions of the active layer to portions other that the stripe portions.

10. A light source apparatus equipped with a GaN type semiconductor light emitting element as defined in claim 1, wherein the GaN type semiconductor light emitting element is a single stripe light emitting element.

11. A light source apparatus equipped with a GaN type semiconductor light emitting element as defined in claim 1, wherein the GaN type semiconductor light emitting element has a single emitter.

12. A method of eliminating stray light comprising the step of
    emitting light from a GaN type semiconductor light emitting element;
    eliminating, by use of a spatial filter, stray light from the light emitted from the light source apparatus equipped with the GaN type semiconductor light emitting element; wherein
    said stray light amounts to 20% or lees of the total output of the light emitted from said GaN type semiconductor light emitting element when said GaN type semiconductor light emitting element is driven at the maximum output thereof,
    the GaN type semiconductor light emitting element has an active layer having stripe portions,
    the stray light is randomly polarized light emitted from portions of the semiconductor light emitting element other than the stripe portions of the active layer, and
    the stray light is cutoff by one of a slit panel and a pinhole panel.

13. A method of eliminating stray light as defined in claim 12, wherein the GaN type semiconductor light emitting element is a single stripe light emitting element.

14. A method of eliminating stray light as defined in claim 12, wherein the GaN type semiconductor light emitting element has a single emitter.

15. A method of eliminating stray light comprising the step of
    emitting light from a GaN type semiconductor light emitting element;
    eliminating, by use of a spatial filter, stray light from the light emitted from the light source apparatus equipped with the GaN type semiconductor light emitting element; wherein
    said stray light amounts to 20% or less of the total output of the light emitted from said GaN type semiconductor light emitting element when said GaN type semiconductor light emitting element is driven at the maximum output thereof, and
    the stray light is stray light that is generated when the drive current of the GaN type semiconductor light emitting element is less than the laser oscillation threshold value.

16. A light source apparatus equipped with a GaN type semiconductor light emitting element, comprising
    a GaN type semiconductor light emitting element;

a spatial filter for eliminating stray light from the light emitted from the GaN type semiconductor light emitting element, wherein said stray light amounts to 20% or less of the total output of the light emitted from said GaN type semiconductor light emitting when said GaN type semiconductor light emitting element is driven at the maximum output thereof, further comprising a focusing optical system for focusing the light emitted from the GaN type semiconductor light emitting element, wherein the spatial filter is formed of a slit panel or a pinhole panel disposed adjacent to the convergence position of the light focused by the focusing optical system, and the stray light is stray light that is generated when the drive current of the GaN type semiconductor light emitting element is less than the laser oscillation threshold value.

17. A light source apparatus equipped with a GaN type semiconductor light emitting element, comprising a GaN type semiconductor light emitting element;

a spatial filter for eliminating stray light from the light emitted from the GaN type semiconductor light emitting element, wherein said stray light amounts to 20% or less of the total output of the light emitted from said GaN type semiconductor light emitting element when said GaN type semiconductor light emitting element is driven at the maximum output thereof, further comprising a focusing optical system for focusing the light emitted from the GaN type semiconductor light emitting element, wherein the spatial filter is formed of a partially reflective mirror that partially reflects the light near the convergence position of the light focused by the focusing optical system, and the stray light is stray light that is generated when the drive current of the GaN type semiconductor light emitting element is less than the laser oscillation threshold value.

18. A light source apparatus equipped with a GaN type semiconductor light emitting element, comprising a GaN type semiconductor light emitting element;

a spatial filter for eliminating stray light from the light emitted from the GaN type semiconductor light emitting element, wherein said stray light amounts to 20% or less of the total output of the light emitted from said GaN type semiconductor light emitting element when said GaN type semiconductor light emitting element is driven at the maximum output thereof, the spatial filter is a polarization element that eliminates the light components other than the TE mode components of the light emitted from the GaN type semiconductor light emitting element, and the stray light is stray light that is generated when the drive current of the GaN type semiconductor light emitting element is less than the laser oscillation threshold value.

19. A device as defined in any one of claims 1 to 6 and 16 to 18, further comprising an image forming apparatus that scans a photosensitive material with a light modulated based on image data to form the image borne by said image data.

20. A method of eliminating stray light comprising the steps of equipping a light source apparatus with a GaN type semiconductor light emitting element;

providing the light source with a spatial filter; and eliminating, by the use of the stray filter, stray light from the emitted light, wherein the stray light amounts to 20% or less of the total output of the light emitted from the GaN type semiconductor light emitting element when the GaN type semiconductor light emitting element is driven at the maximum output thereof, the GaN type semiconductor light emitting element has an active layer having stripe portions, the stray light is randomly polarized light emitted from portions of the semiconductor light emitting element other than the stripe portions of the active layer, and the stray light is cutoff by one of a slit panel and a pinhole panel.

21. A method of eliminating stray light comprising the steps of equipping a light source apparatus with a GaN type semiconductor light emitting element;

providing the light source with a spatial filter; and eliminating, by use of the stray filter, stray light from the emitted light, wherein the stray light amounts to 20% or less of the total output of the light emitted from the GaN type semiconductor light emitting element when the GaN type semiconductor light emitting element is driven at the maximum output thereof, and the stray light is stray light that is generated when the drive current of the GaN type semiconductor light emitting element is less than the laser oscillation threshold value.

22. A light source apparatus equipped with a GaN type semiconductor light emitting element, comprising a GaN type semiconductor light emitting element;

a spatial filter for eliminating stray light from the light emitted from the GaN type semiconductor light emitting element, wherein said stray light amounts 20% or less of the total output of the light emitted from said GaN type semiconductor light emitting element when said GaN type semiconductor light emitting element is driven at the maximum output thereof, further comprising a focusing optical system for focusing the light emitted from the GaN type semiconductor light emitting element, wherein the spatial filter is formed of a slit panel or a pinhole panel disposed adjacent to the convergence position of the light focused by the focusing optical system, the GaN type semiconductor light emitting element has an active layer having stripe portions, the stray light is randomly polarized light emitted from portions of the semiconductor light emitting element other than the stripe portions of the active layer, and the stray light is cutoff by the slit panel.

* * * * *